(12) United States Patent
Lindner

(10) Patent No.: US 9,655,256 B2
(45) Date of Patent: May 16, 2017

(54) ELECTRONIC CIRCUIT BOARDS FASTENED AT A FRAME

(71) Applicant: Hella KGaA Hueck & Co., Lippstadt (DE)

(72) Inventor: Gunnar Lindner, Paderborn (DE)

(73) Assignee: Hella KGaA Hueck & Co., Lippstadt (DE)

( * ) Notice: Subject to any disclaimer, the term of this patent is extended or adjusted under 35 U.S.C. 154(b) by 33 days.

(21) Appl. No.: 14/351,979

(22) PCT Filed: Oct. 25, 2012

(86) PCT No.: PCT/EP2012/071115
§ 371 (c)(1),
(2) Date: Apr. 15, 2014

(87) PCT Pub. No.: WO2013/060760
PCT Pub. Date: May 2, 2013

(65) Prior Publication Data
US 2014/0301048 A1    Oct. 9, 2014

(30) Foreign Application Priority Data
Oct. 26, 2011   (DE) .................. 10 2011 054 818

(51) Int. Cl.
*H05K 5/00* (2006.01)
*H05K 1/14* (2006.01)

(52) U.S. Cl.
CPC .......... *H05K 5/0026* (2013.01); *H05K 1/144* (2013.01); *H05K 2201/042* (2013.01);
(Continued)

(58) Field of Classification Search
CPC ...... H05K 5/0026; H05K 1/144; H05K 1/145; H05K 2201/042; H05K 2201/10303; H05K 2201/10424; H05K 2201/2018
See application file for complete search history.

(56) References Cited

U.S. PATENT DOCUMENTS 5,548,486 A * 8/1996 Kman ................. H01R 12/58
361/744
5,691,041 A * 11/1997 Frankeny ............. H05K 3/325
257/712

(Continued)

FOREIGN PATENT DOCUMENTS

DE           9109072 U1    12/1991
DE          10159063 A1     8/2003
(Continued)

*Primary Examiner* — Zachary M Pape
*Assistant Examiner* — Douglas Burtner
(74) *Attorney, Agent, or Firm* — Husch Blackwell LLP

(57) ABSTRACT

An electronic circuit, comprising at least three circuit boards (2.1, 2.2, 2.3) fastened at a frame (1) and electrically connected via contact pins (7) arranged therein, and an electric connection (11), connected to a third of the circuit boards (2.1). The circuit shall show a low structural space and here be cost-effective in its production and assembly. The circuit boards (2.1, 2.2, 2.3) are arranged in levels parallel in reference to each other and are fastened at a predetermined mutual distance at the frame (1), with bases (4, 5, 6) being embodied at the faces of the frame (1), with the ends being parallel to the faces of at least two of the bases (4, 5, 6) in one level, arranged in groups, and with the embodiment of the frame (1) and the circuit boards (2.1, 2.2, 2.3) being adjusted to each other.

8 Claims, 2 Drawing Sheets

(52) U.S. Cl.
CPC .............. *H05K 2201/10106* (2013.01); *H05K 2201/10303* (2013.01); *H05K 2201/10424* (2013.01); *H05K 2201/2018* (2013.01); *H05K 2203/0495* (2013.01)

(56) References Cited

U.S. PATENT DOCUMENTS

| | | | | |
|---|---|---|---|---|
| 5,713,747 | A * | 2/1998 | Hsia | H01R 12/716 439/541.5 |
| 5,721,671 | A | 2/1998 | Ruque | |
| 6,692,310 | B2 * | 2/2004 | Zaderej | H01R 13/514 439/541.5 |
| 6,773,269 | B1 * | 8/2004 | Downes | H01R 12/523 439/55 |
| 8,107,244 | B2 * | 1/2012 | Reimund | H05K 7/1435 361/729 |
| 2002/0100965 | A1 * | 8/2002 | Matsuura | H01L 25/105 257/686 |
| 2004/0104469 | A1 * | 6/2004 | Yagi | G06K 19/07 257/723 |
| 2004/0196727 | A1 * | 10/2004 | Garnett | G06F 1/183 365/232 |
| 2005/0032398 | A1 * | 2/2005 | Perret | H05K 1/147 439/67 |
| 2005/0073819 | A1 * | 4/2005 | McCubbrey | G06F 17/5054 361/785 |
| 2007/0053167 | A1 * | 3/2007 | Ueda | H01L 23/3121 361/717 |
| 2008/0007895 | A1 * | 1/2008 | Shimoirisa | H05K 1/14 361/600 |
| 2008/0054430 | A1 * | 3/2008 | Coteus | H05K 3/325 257/686 |
| 2008/0121900 | A1 | 5/2008 | Wu et al. | |
| 2008/0207020 | A1 * | 8/2008 | Decker | H05K 1/144 439/78 |
| 2009/0091897 | A1 * | 4/2009 | Willing | H02M 7/003 361/752 |
| 2009/0140399 | A1 | 6/2009 | Schulz et al. | |
| 2010/0165562 | A1 * | 7/2010 | Segaram | G06F 1/185 361/679.31 |
| 2011/0042124 | A1 * | 2/2011 | Matsui | H05K 1/0274 174/157 |

FOREIGN PATENT DOCUMENTS

| | | |
|---|---|---|
| DE | 102007015938 A1 | 12/2008 |
| DE | 102007038538 A1 | 2/2009 |
| DE | 102009015312 A1 | 10/2009 |
| EP | 1032042 A2 | 8/2000 |
| EP | 1033525 A2 | 9/2000 |
| EP | 1641096 A1 | 3/2006 |
| WO | 2009002026 A2 | 12/2008 |

* cited by examiner

ELECTRONIC CIRCUIT BOARDS FASTENED AT A FRAME

CROSS REFERENCE

This application is a national phase application of PCT/EP2012/071115 filed on Oct. 25, 2012 based on German Patent Application No. 10 2011 054818.1, filed Oct. 26, 2011.

TECHNICAL FIELD OF THE INVENTION

The invention relates to an electronic circuit, comprising at least three circuit boards, which are fastened at a frame and electrically connected via contact pins arranged therein, and an electric connection, which is connected to a first of the circuit boards.

BACKGROUND OF THE INVENTION

Such circuits are known per se. They are used, e.g., in motor vehicles for sensors, controls, lighting, or as transceiver devices.

DE 10 2007 038 538 A1 describes a housing for an electric circuit. It comprises a base, a lid, and an electric connection. A penetration for the connection is arranged in the lid or in the base.

A sensor arrangement is known from DE 101 59 063 A1 with a housing, in which a circuit board is arranged. In order to guide and fixate the circuit board, fixing pins are arranged in the housing, which are elastic and contact receptacles of the circuit board under pre-stressing.

These circuits of prior art are disadvantageous in that only a single circuit board is arranged. This way, they show a relatively large area and require appropriate structural space.

Furthermore, it is known to arrange circuit boards in parallel levels, e.g., on top of each other. Here, the circuit boards are held via spacers at a predetermined relative position in reference to each other. The spacers are fastened at the circuit boards, e.g., latched or screwed. The costs for the production and assembly here are relatively high.

Furthermore, it is known to fasten two circuit boards at a frame and to electrically connect them to each other by contact pins arranged in the frame. In a predetermined area, here the arrangement of electric and/or electronic components is limited. Inversely, in case of a predetermined arrangement of the components a larger area is required.

SUMMARY OF THE INVENTION

In light of this background the objective of the invention is to provide an electronic circuit, which shows a small structural space and is cost-effective here in its production and assembly.

The objective is attained in the features of claim 1.

The circuit boards are arranged parallel in levels in reference to each other and held at the frame at a predetermined mutual distance, with the embodiment of the frame and the circuit boards being adjusted to each other. This way, electric and/or electronic components can be optimally distributed over the circuit boards so that the electronic circuit overall requires a relatively small area. The mutual distance of the circuit boards and thus the structural height of the circuit results from the height of the components and their mutual minimum distance; the structural height can be optimized by an appropriate distribution of the components over the individual circuit boards. The circuit boards may project out of the frame.

Bases are formed at least at one face of the frame, with ends of at least two of the bases being aligned in groups parallel to the faces. This means that the ends are framed by at least two bases, allocated to the same group, and located in the same level. The height of the bases is adjusted here to the predetermined distance of the circuit boards so that it is securely maintained. A first circuit board is fastened and contacted at a level bottom of the frame. The other circuit boards are fastened and contacted at the bases allocated to them.

This frame can be produced in a cost-effective fashion. Contact pins are inserted into the frame according to the required number and positioning. Here, it is advantageous to provide a larger number of potential positions for the contact pins in the frame in order to allow using the frame for various applications and/or for changed requirements of the circuit.

Overall, an electronic circuit can be produced in a cost-effective fashion and with little area as well as spacial needs as a package of circuit boards.

The dependent claims relate to the advantageous embodiment of the invention.

In one embodiment the contact pins are embodied as impressed contacts. This allows an easy assembly of the circuit boards by pressing them onto the frame, with the contact pins penetrating appropriate contact apertures in the circuit boards. Here, an electric and mechanic connection develops between the contact pin and the corresponding contact aperture by way of cold welding, so that the mechanic fastening of the circuit board at the frame and the electric contacting are ensured simultaneously.

In another embodiment a plurality of LED is arranged on at least one of the circuit boards. This way, compact light assemblies can be produced, e.g., tail lights for vehicles. Here, groups of LED can be formed for various functions, e.g., for tail light, brake light, and turn signal.

In another embodiment at least one block is formed at the frame. This way, additional supports can be formed for the circuit boards and perhaps additional contact points.

These aspects are merely illustrative of the innumerable aspects associated with the present invention and should not be deemed as limiting in any manner. These and other aspects, features and advantages of the present invention will become apparent from the following detailed description when taken in conjunction with the referenced drawings.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION

In the following detailed description numerous specific details are set forth in order to provide a thorough understanding of the invention. However, it will be understood by those skilled in the art that the present invention may be practiced without these specific details. For example, the invention is not limited in scope to the particular type of industry application depicted in the figures. In other instances, well-known methods, procedures, and components have not been described in detail so as not to obscure the present invention.

Figure 1:
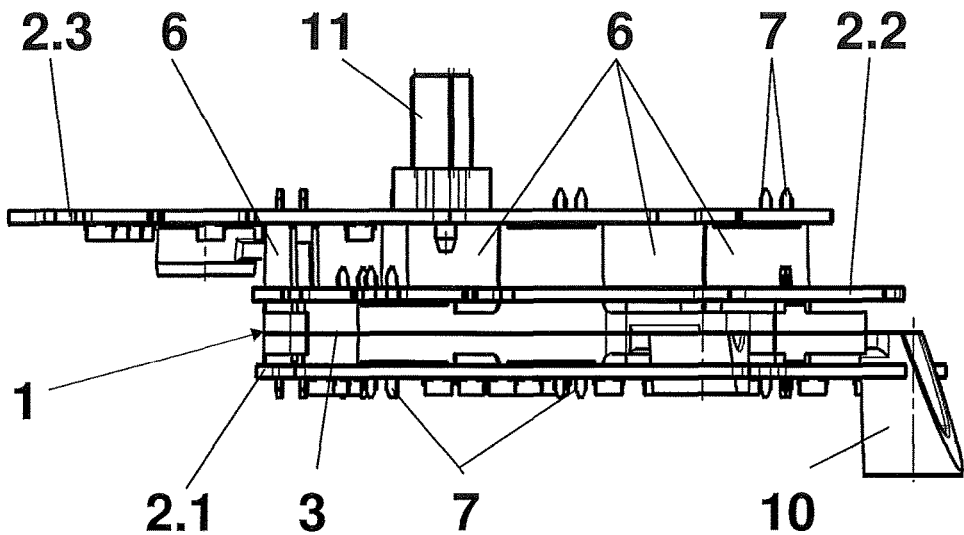
FIG. 1: a side view of a circuit.
Figure 2:
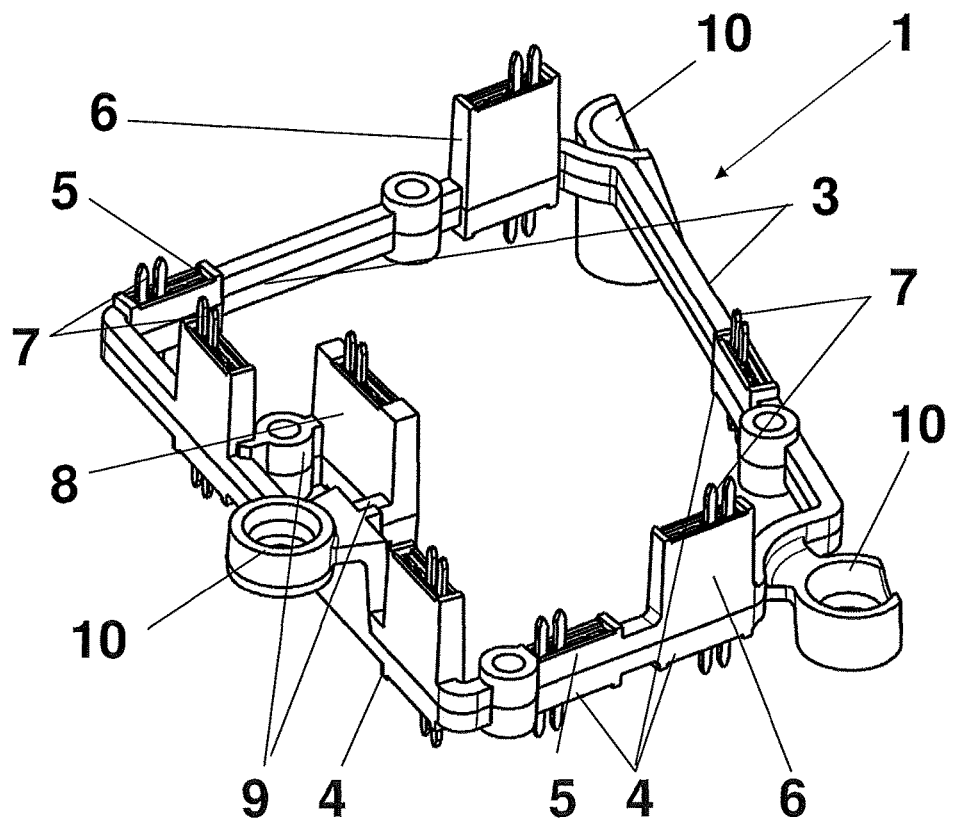
FIG. 2: a perspective view of a frame.
Figure 3:
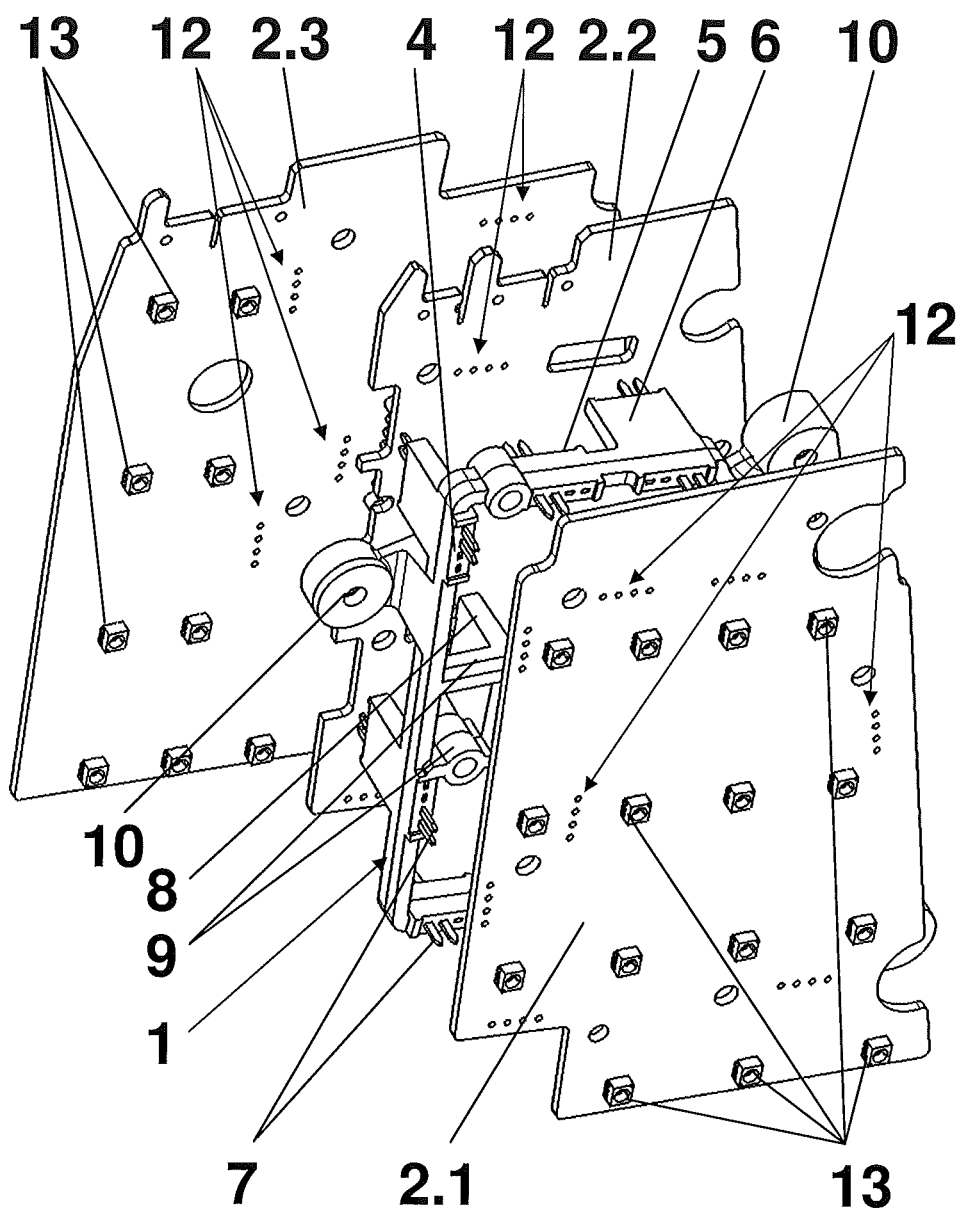
FIG. 3: a perspective, exploded illustration of the circuit.

As discernible from FIGS. 1 through 3, an electronic circuit comprises a frame 1, at which three circuit boards 2.1, 2.2, 2.3 are fastened with electric and/or electronic components.

The frame 1 is embodied in one piece from walls 3, arranged in the form of a tetragon, here a trapeze. The walls 3 essentially show a constant thickness as well as a basic height.

From a face of the frame 1, according to the figures a bottom one, seven first bases 4 project, with each of them extending over at least the entire thickness of the corresponding wall 3 and over a predetermined length. The first bases 4 show an identical low height, amounting to less than 1 mm, here. Upper ends of the first bases 4 are located in a first level parallel to the face. The number and length of the first bases 4 depend on the required contacts between the circuit boards 2.1, 2.2, 2.3 and a necessary mechanic stability of the circuit.

Three second and four third bases 5, 6 are formed on an upper face of the frame 1 such that each of these bases 5, 6 is aligned to one of the first bases 4.

The second bases 5 show identical, low heights. The upper ends of the second bases 5 are located in a second level. Penetrating bores are inserted into every other base 5, perpendicular to the faces of the frame 1 and penetrating the second base 5 as well as the allocated first base 4. Contact pins 7 are fastened in at least some of the penetrating bores.

The third bases 6 show identical heights, and with e.g., 3 mm to 10 mm they are considerably greater than the heights of the second bases 5. Upper ends of the third bases 6 are located in a third level. Penetrating bores are inserted into every third of the bases 6, perpendicular in reference to the faces of the frame 1 and penetrating the third base 6 as well as the allocated first base 4. Contact pins 7 are fastened in at least some of the penetrating bores.

The first, the second, and the third level are parallel.

All bases 4, 5, 6, show a width equivalent to at least the thickness of the walls 3; a length of the bases 4, 5, 6 is sized according to the number of penetrating bores of the respective base 4, 5, 6, with a minimum distance of the penetrating bores being predetermined.

A block 8 is formed at the frame 1, by which it is connected via two bars 9, pointing to the frame 1, to one of the walls 3. A bottom end of the block 8 is located in a first level, an upper end in a third level. Similar to the bases 4, 5, 6, penetrating bores are inserted into the block 8, with contact pins 7 being fastened in at least some of them. A width of the block 8 is approximately equivalent to the bases 4, 5, 6 and a length is determined based on the number of penetrating bores.

In an alternative embodiment several blocks 8 are arranged. In another alternative, upper ends of the block 8 and/or the blocks 8 end in the second level. The bars 9 may point inwardly or outwardly, depending on whether the corresponding block 8 is arranged inside or outside the frame 1.

Furthermore, fastening apertures 10 are arranged at the frame 1, in order to fasten the circuit, e.g., in a housing.

Each of the circuit boards 2.1, 2.2, 2.3 is fastened in an allocated level. A plug 11 is fastened at a third of the circuit boards 2.3 and contacted for an electric connection of the circuit. A plurality of LED 13 is arranged on surfaces of the third and a first of the circuit boards 2.3, 2.1 such that light can be emitted from the finished assembled circuit in the same primary direction.

In one alternative embodiment, the first bases 4 are omitted. The first circuit board 2.1 is then directly fastened on the bottom face.

The frame 1 and the circuit boards 2.1, 2.2, 2.3 are adjusted to each other. This means that contact apertures 12 in the circuit boards 2.1, 2.2, 2.3 correspond to the contact pins 7 and that the circuit boards 2.1, 2.2, 2.3 show apertures according to the embodiment of the frame 1 in order to allow assembly of the circuit boards in the allocated levels.

For the production of the circuit the frame 1 is produced together with the block 8 and the fastening apertures 10 from plastic in an injection molding process. Here, the contact pins 7 are either inserted into an appropriate mold prior to the injection molding process and injected into the frame 1, or they are shot into the frame 1.

The first circuit board 2.1 is fastened on the first bases 4, at least partially projecting beyond the frame 1. For this purpose, the contact apertures 12, arranged corresponding to the contact pins 7 on the first circuit board 2.1, are pressed onto the contact pins 7. Here, the LED 13 show the same alignment as the first bases 4. This way, by way of compression, the contact pins 7 are cold welded to the contact apertures 12.

Subsequently, the second circuit board 2.2 is pressed onto the other side of the frame 1 and here is cold welded. For this purpose, the second circuit board 2.2 is supported on the second bases 5.

Finally, the third circuit board 2.3 is pressed onto the frame 1 such that it rests on the third bases 6. The LED 13 are arranged on the part of the third circuit board 2.3 projecting from the frame 1.

LIST OF REFERENCE CHARACTERS

1 Frame
2 Circuit board
3 Wall
4 First base
5 Second base
6 Third base
7 Contact pin
8 Block
9 Bar
10 Fastening aperture
11 Plug
12 Contact aperture
13 LED

The invention claimed is:

1. An electronic circuit, comprising:
a single frame;
at least three circuit boards, fastened to the single frame and electrically connected via contact pins arranged therein and arranged in levels parallel in reference to each other and fastened at the frame at a predetermined mutual distance from one another;
and an electric connection connected to a third of the circuit boards;
the frame including a plurality of bases projecting from a first face of the frame, wherein at least a first group of at least two bases extends from the first face of the frame to a first level above the frame to connect to a middle of the three circuit boards, and at least a second group of at least two bases extends from the first face of the frame to a second level above the frame past the middle of the three circuit boards to connect to an upper of the three circuit boards, and wherein the first group of at least two bases are lower in height than the second group of at least two bases;

the frame also including at least a third group of at least two bases projecting from a second face of the frame opposite the first face of the frame to a third level below the first and second levels to connect to a lower of the three circuit boards.

2. A circuit according to claim 1, wherein the contact pins are impressed contacts.

3. A circuit according to claim 1, wherein a plurality of LED is arranged on at least one of the circuit boards.

4. A circuit according to claim 1, wherein at least one block is formed at the frame.

5. A circuit according to claim 2, wherein a plurality of LED is arranged on at least one of the circuit boards.

6. A circuit according to claim 2, wherein at least one block is formed at the frame.

7. A circuit according to claim 3, wherein at least one block is formed at the frame.

8. A circuit according to claim 5, wherein at least one block is formed at the frame.

\* \* \* \* \*